(12) United States Patent
Yang et al.

(10) Patent No.: US 8,536,072 B2
(45) Date of Patent: Sep. 17, 2013

(54) SEMICONDUCTOR PROCESS

(75) Inventors: Chan-Lon Yang, Taipei (TW);
Ching-Nan Hwang, Taichung (TW);
Chi-Heng Lin, Hsinchu (TW);
Chun-Yao Yang, Kaohsiung (TW);
Ger-Pin Lin, New Taipei (TW); Ching-I Li, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/368,006

(22) Filed: Feb. 7, 2012

(65) Prior Publication Data

US 2013/0203226 A1 Aug. 8, 2013

(51) Int. Cl.
*H01L 21/00* (2006.01)

(52) U.S. Cl.
USPC .......... 438/799; 257/380; 257/538; 438/238; 438/385

(58) Field of Classification Search
USPC ......... 438/799, 238, 382, 384, 385; 257/380, 257/381, 538, 904, E21.004, E21.005, E21.35, 257/E29.176
See application file for complete search history.

(56) References Cited

U.S. PATENT DOCUMENTS

| | | | |
|---|---|---|---|
| 4,658,378 A | 4/1987 | Bourassa | |
| 5,236,857 A | 8/1993 | Eklund et al. | |
| 5,489,547 A * | 2/1996 | Erdeljac et al. | 438/238 |
| 6,261,915 B1 | 7/2001 | Eklund et al. | |
| 6,855,607 B2 | 2/2005 | Achuthan et al. | |
| 7,013,446 B2 | 3/2006 | Ohba et al. | |
| 7,112,495 B2 | 9/2006 | Ko et al. | |
| 7,250,658 B2 | 7/2007 | Doris et al. | |
| 7,521,324 B2 | 4/2009 | Ohmi et al. | |
| 7,531,437 B2 | 5/2009 | Brask et al. | |
| 7,592,270 B2 | 9/2009 | Teo et al. | |
| 7,737,385 B2 | 6/2010 | Timans et al. | |
| 7,977,754 B2 | 7/2011 | Chuang et al. | |
| 2006/0166457 A1 * | 7/2006 | Liu et al. | 438/400 |
| 2007/0015365 A1 | 1/2007 | Chen et al. | |
| 2007/0072376 A1 | 3/2007 | Chen et al. | |
| 2007/0218661 A1 | 9/2007 | Shroff et al. | |
| 2008/0061366 A1 | 3/2008 | Liu et al. | |
| 2009/0057759 A1 | 3/2009 | Obradovic et al. | |
| 2009/0124097 A1 | 5/2009 | Cheng | |
| 2009/0170273 A1 | 7/2009 | Park et al. | |
| 2009/0200494 A1 | 8/2009 | Hatem et al. | |
| 2010/0044783 A1 | 2/2010 | Chuang et al. | |
| 2010/0048027 A1 | 2/2010 | Cheng et al. | |
| 2010/0084580 A1 * | 4/2010 | Ramappa | 250/492.21 |
| 2010/0084583 A1 * | 4/2010 | Hatem et al. | 250/492.21 |

(Continued)

OTHER PUBLICATIONS

Moroz, V., Oh, Y. S., Pramanik, D., Graoui, H., & Foad, M. A. (2005). Optimizing boron junctions through point defect and stress engineering using carbon and germanium co-implants. Applied Physics Letters, 87(5), 051908-051908.*

(Continued)

*Primary Examiner* — Fernando L Toledo
*Assistant Examiner* — Christine C Lau
(74) *Attorney, Agent, or Firm* — J.C. Patents (57) ABSTRACT

A semiconductor process is provided, including following steps. A polysilicon layer is formed on a substrate. An asymmetric dual-side heating treatment is performed to the polysilicon layer, wherein a power for a front-side heating is different from a power for a backside heating.

28 Claims, 4 Drawing Sheets

(56) References Cited

U.S. PATENT DOCUMENTS

2010/0129994 A1    5/2010   Awad et al.
2010/0164001 A1    7/2010   Park et al.
2010/0279479 A1*  11/2010   Hatem et al. .................. 438/300
2012/0083135 A1*   4/2012   Tsai et al. ..................... 438/795

OTHER PUBLICATIONS

Sanuki et al., "High-Performance 45nm node CMOS Transistors Featuring Flash Lamp Annealing (FLA)", Electron Devices Meeting, Dec. 10-12, 2007, pp. 281-284.

Ahsan et al., "RTA-Driven Intra-Die Variations in Stage Delay, and Parametric Sensitivities for 65nm Technology", 2006 Symposium on VLSI Technology Digest of Technical Papers, Apr. 2005, pp. 170-171.

"Synopsys and Varian Collaborate on Process Models for Advanced Logic and Memory Technologies", http://synopsys.mediaroom.com/index.php?s=43&item=899: posted on Feb. 10, 2011.

Anthony Renau, "Device performance and yield—A new focus for ion implantation," International Workshop on Junction Technology, May 10-11, 2010, pp. 1-6.

* cited by examiner

SEMICONDUCTOR PROCESS

BACKGROUND OF THE INVENTION

1. Field of the Invention

The present invention relates to a semiconductor process, and more particularly, to a polysilicon annealing treatment and to a method for fabricating a polysilicon resistor.

2. Description of Related Art

Along with rapid progress of semiconductor technology, dimensions of semiconductor devices are reduced and integrity thereof is promoted continuously to further advance operating speed and performance of integrated circuits (ICs). As the demand for device integrity is raised, any tiny variation in device characteristics or non-uniformity in fabrication process has to be considered so as to avoid a great impact on reliability, operating speed and the performance of the device.

SUMMARY OF THE INVENTION

Accordingly, the present invention is directed to a semiconductor process, capable of providing better process uniformity even with different pattern layout.

A semiconductor process of the present invention is described as follows. A polysilicon layer is formed on a substrate. An asymmetric dual-side heating treatment is performed to the polysilicon layer, wherein a power for a front-side heating is different from a power for a backside heating.

Another semiconductor process of the present invention is described as follows. An isolation structure is formed in a substrate. A polysilicon layer is formed on the isolation structure. The polysilicon layer is cryo-implanted with a first species, a second species and a third species at a temperature ranging between −40° C. and −120° C., wherein the first species, the second species and the third species are different.

According to an embodiment of the present invention, after the polysilicon layer is cryo-implanted with the first species, the second species and the third species, the semiconductor process further includes performing an asymmetric dual-side heating treatment to the substrate, wherein a power for a front-side heating is different from a power for a backside heating.

Still another semiconductor process of the present invention is described as follows. An isolation structure is formed in a substrate. A polysilicon stack is formed on the isolation structure. A gate structure is formed on the substrate. The polysilicon stack is cryo-implanted with a first species, a second species and a third species at a temperature ranging between −40° C. and −120° C., wherein the first species, the second species and the third species are different. Doped regions are formed in the substrate adjacent to respective sides of the gate structure. An asymmetric dual-side heating treatment is performed to the substrate for annealing the polysilicon stack and for activating the doped regions, wherein a power for a front-side heating is different from a power for a backside heating.

According to an embodiment of the present invention, the step of cryo-implanting the polysilicon layer or the polysilicon stack is performed with liquid nitrogen or at a temperature ranging between −40° C. and −120° C.

According to an embodiment of the present invention, the first species includes a germanium species, the second species includes a carbon species, and the third species includes a p-type species or an n-type species. In an embodiment, the third species may include a boron species.

According to an embodiment of the present invention, the third species is cryo-implanted into the polysilicon layer or the polysilicon stack after cryo-implanting the first species and the second species.

According to an embodiment of the present invention, the power for the backside heating is greater than the power for the front-side heating.

According to an embodiment of the present invention, a power ratio of the front-side heating to the backside heating ranges between 0.1:1 and 0.5:1.

According to an embodiment of the present invention, a power ratio of the front-side heating to the backside heating is substantially 0.2:1.

According to an embodiment of the present invention, the asymmetric dual-side heating treatment includes a spike annealing process.

According to an embodiment of the present invention, the semiconductor process further includes performing a laser annealing process to the substrate after performing the asymmetric dual-side heating treatment.

As mentioned above, in the semiconductor process of the present invention, the asymmetric dual-side heating treatment is performed to the polysilicon layer or stack, and thus, pattern effect caused by varied thermal properties of different materials can be minimized and improved. The polysilicon layer or stack is implanted at low temperature, thereby mitigating variation in polysilicon resistance which is sensitive to the difference in heating temperature, such that the process uniformity can be achieved.

In order to make the aforementioned and other features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIGS. 1A-1F depict, in a cross-sectional view, a semiconductor process according to an embodiment of the present invention.

Figure 1A:
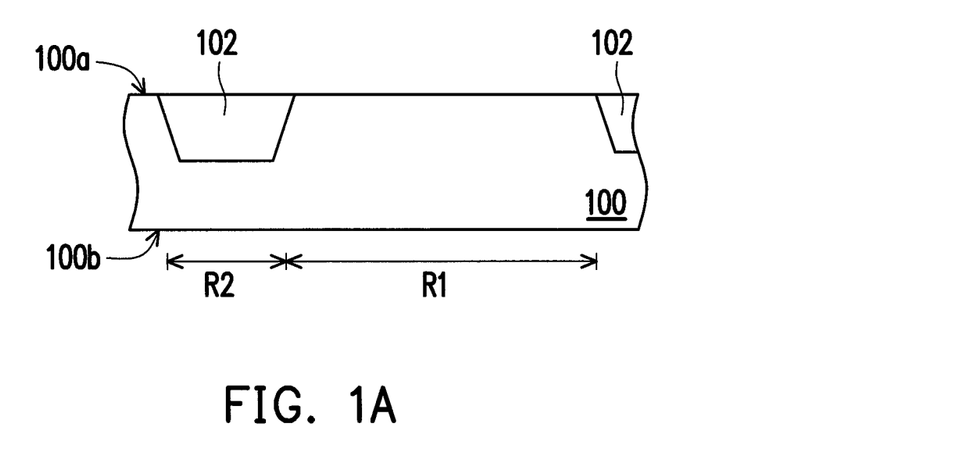
FIGS. 1A-1E depict, in a cross-sectional view, a semiconductor process according to an embodiment of the present invention.

Referring to FIG. 1A, a substrate 100 is provided, having a first surface 100a and a second surface 100b. The substrate 100 can be a semiconductor wafer, e.g. an N-type or a P-type silicon wafer, whereon thin films, conductive parts, or even semiconductor devices may be formed. Isolation structures 102 are formed in the substrate 100 at the first surface 100a side, so as to define a first region R1 and a second region R2. The isolation structures 102 are, for example, shallow trench isolation (STI) structures or field oxide (FOX) structures, and may be made of insulating material such as silicon oxide, silicon nitride or combinations thereof. In an embodiment, the first region R1 may be an active region for forming a variety of core devices, such as a MOS transistor, a CMOS transistor or other suitable active devices, while the second region R2 may be a region for forming a high-resistance device, such as a polysilicon resistor or the like.

For illustration purposes, the following disclosure is described in terms of a MOS transistor and a polysilicon resistor incorporated on the first surface 100a of the substrate 100, which is illustrated only as an exemplary example, and should not be adopted for limiting the scope of the present invention. The MOS transistor to be formed is not particularly limited by the present invention, whereas people skilled in the art should be able to embody the invention based on the illustration to obtain the polysilicon resistor with desirable properties. It is to be appreciated by those of ordinary skill in the art that other elements, such as a gate structure, source and drain regions, and even source drain extension regions, can be arranged and fabricated based on techniques known to people skilled in the art, and are not limited to the descriptions in the following embodiments.

Figure 1B:
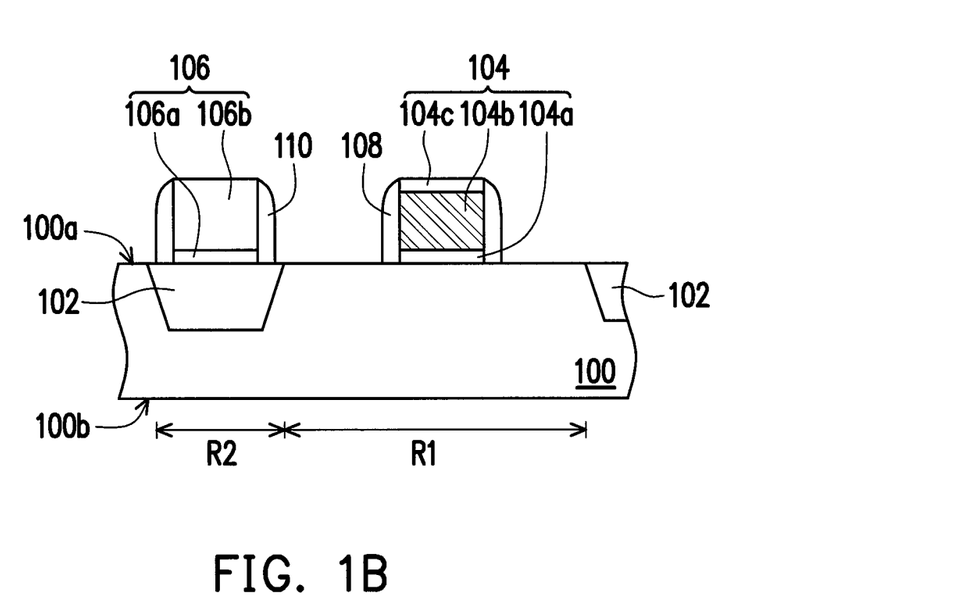

Referring to FIG. 1B, a gate structure 104 is formed on the first surface 100a of the substrate 100 within the first region R1, and a polysilicon stack 106 is formed on the first surface 100a of the substrate 100 within the second region R2, that is, on the isolation structure 102. The gate structure 104 may include a dielectric layer 104a, a conductor layer 104b and a cap layer 104c. The dielectric layer 104a intervening between the conductor layer 104b and the substrate 100 can be made of silicon oxide, silicon nitride or combinations thereof. Alternatively, the dielectric layer 104a may be a composite structure of a silicon oxide layer and a high-k dielectric layer. The high-k dielectric layer is made of, for example, a dielectric material with a dielectric constant greater than 4, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), or hafnium zirconium oxide (HfZrO). The conductor layer 104b may be made of undoped polysilicon or doped polysilicon. In an alternative embodiment, in the case of a metal gate, the conductor layer 104b can be a composite structure including, in addition to the polysilicon layer, a barrier layer (e.g. TiN layer), a work function metal layer and so on. The cap layer 104c can be formed of silicon oxide, silicon nitride, silicon carbide or silicon oxynitride, for instance.

The polysilicon stack 106 may include a dielectric layer 106a and a polysilicon layer 106b, wherein the dielectric layer 106a is formed between the polysilicon layer 106b and the isolation structure 102. The dielectric layer 106a is, for example, made of silicon oxide, silicon nitride, high-k material, or combinations thereof. In this step, polysilicon layer 106b is formed of undoped polysilicon. It should be noticed that when the conductor layer 104b of the gate structure 104 include polysilicon material, the gate structure 104 and the polysilicon stack 106 may be formed simultaneously with the same processing steps, such that the dielectric layer 106a can be formed of the same material of the dielectric layer 104a. In another embodiment, the gate structure 104 and the polysilicon stack 106 may be formed independently in varying processing steps and materials.

In an embodiment, a pair of spacers 108 is then formed on respective sidewalls of the gate structure 104, and a pair of spacers 110 is formed on respective sidewalls of the polysilicon stack 106. The spacers 108 and 110 may include a dielectric material, such as silicon nitride, silicon oxide, silicon carbide, silicon oxynitride, or combinations thereof. For illustration purposes, the spacers 108 and 110 are described in terms of single-layered spacers as shown in FIG. 1B. Each of the spacers 108 and 110, nevertheless, can be made of a composite structure, which is not particularly limited by the present invention.

Figure 1C:
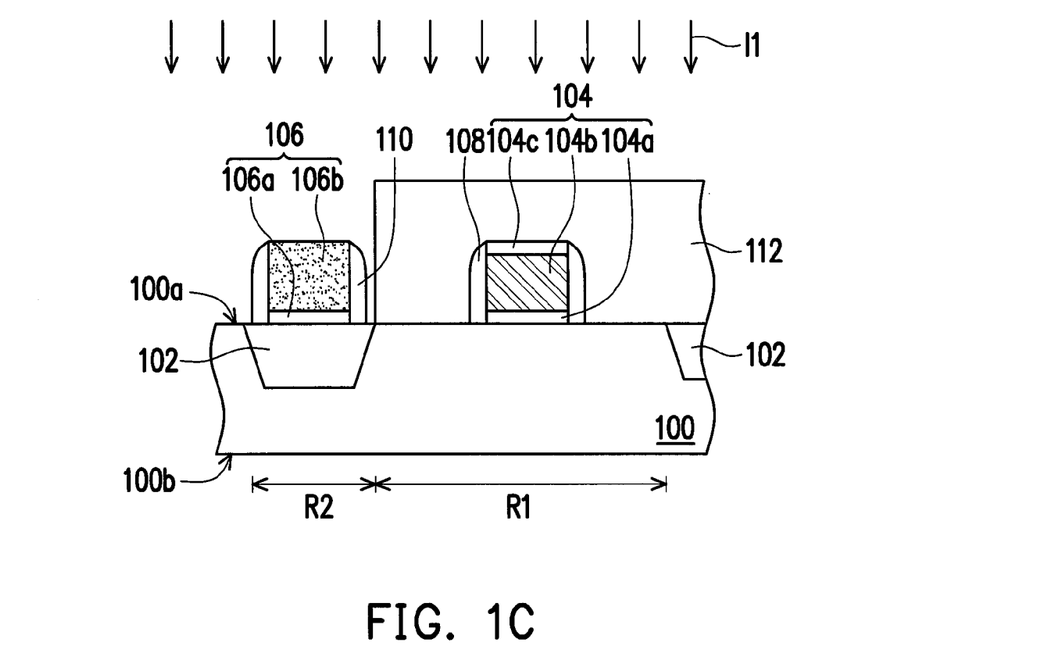

Referring to FIG. 1C, a cryo-implantation process I1 is performed while the first region R1 may be covered by a mask layer 112. The mask layer 112 is, for example, made of photoresist or dielectric material. During the cryo-implantation process I1, the polysilicon stack 106 is co-implanted with a first species, a second species and a third species at a temperature ranging between about −40° C. and −120° C., wherein the first species, the second species and the third species are different. The cryo-implantation process I1 can be performed with liquid nitrogen or performed at a temperature substantially of −100° C. In an embodiment, the first species mentioned above may be a germanium species, the second species may be a carbon species, and the third species may be a p-type species, e.g. a boron species. In another embodiment, the third species may be an n-type species, such as phosphorus or arsenic species.

For example, the polysilicon layer 106b can be implanted with, in order, the germanium species, the carbon species and the boron species in the cryo-implantation process I1. The implanted germanium species is implanted into the polysilicon layer 106b for pre-amorphization implantation (PAI), in which appropriate amounts of energy and dosage can change grain size or formation of the polysilicon lattice so as to alleviate transient enhanced diffusion (TED) effect of boron. The implanted carbon species can efficiently suppress the boron diffusion, and may also function as PAI in the cryo-implantation process I1. After the co-implantation of the germanium and carbon species, the boron species serving as dopants can be implanted into the polysilicon layer 106b for tuning resistance of the polysilicon resistor to be formed.

Figure 1D:
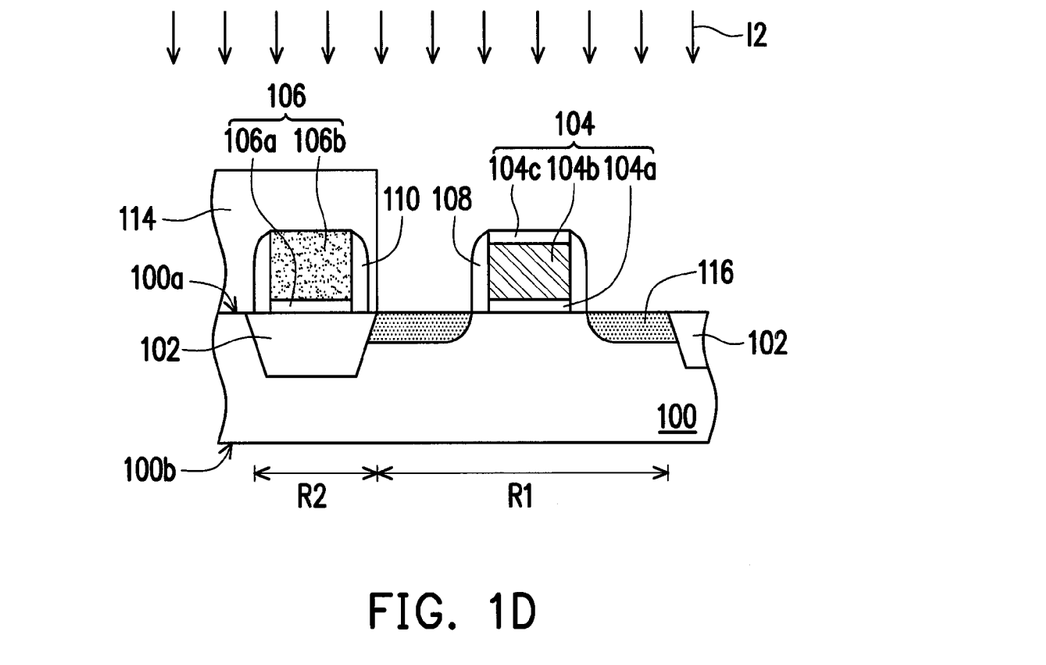

Referring to FIG. 1D, an implantation process I2 is performed while the second region R2 may be covered by a mask layer 114. The mask layer 114 is, for example, made of photoresist or dielectric material. During the implantation process I2, doped regions 116 are formed in the substrate 100 adjacent to respective sides of the gate structure 104, thereby serving as a source region and a drain region. For a PMOS transistor, the doped regions 116 are implanted with p-type dopants, such boron or $BF_2^+$. For an NMOS transistor, the doped regions 116 are implanted with n-type dopants, such as phosphorous or arsenic. The implantation process I2 can be a cryo-implantation process which is carried out at a temperature, for example, about −40° C. to −120° C.

In this embodiment, the doped regions 116 are formed separately from the cryo-implantation process I1 for the polysilicon stack 106, so as to facilitate fine adjustment in the resistance of the polysilicon resistor owing to the independent ion implantation processes. In another embodiment, the doped regions 116 may be formed while cryo-implanting the polysilicon stack 106, so that a simultaneous cryo-implantation process is performed to the first region R1 and the second region R2 without the coverage of the mask layers 112 and 114.

It is remarked that a selective epitaxy growth (SEG) process, in another embodiment, can be incorporated into the formation of the source and drain regions, in which a portion of the substrate 100 at the respective sides of the gate structure 104 is removed to form trenches (not shown), and the SEG process is then performed, so as to form SiGe epitaxial layers for the PMOS or form SiC epitaxial layers for the NMOS in the trenches. Afterwards, the dopants for the source and drain regions are implanted into the SiGe or SiC epitaxial layers in a similar manner illustrated in FIG. 1D, for instance.

Figure 1E:
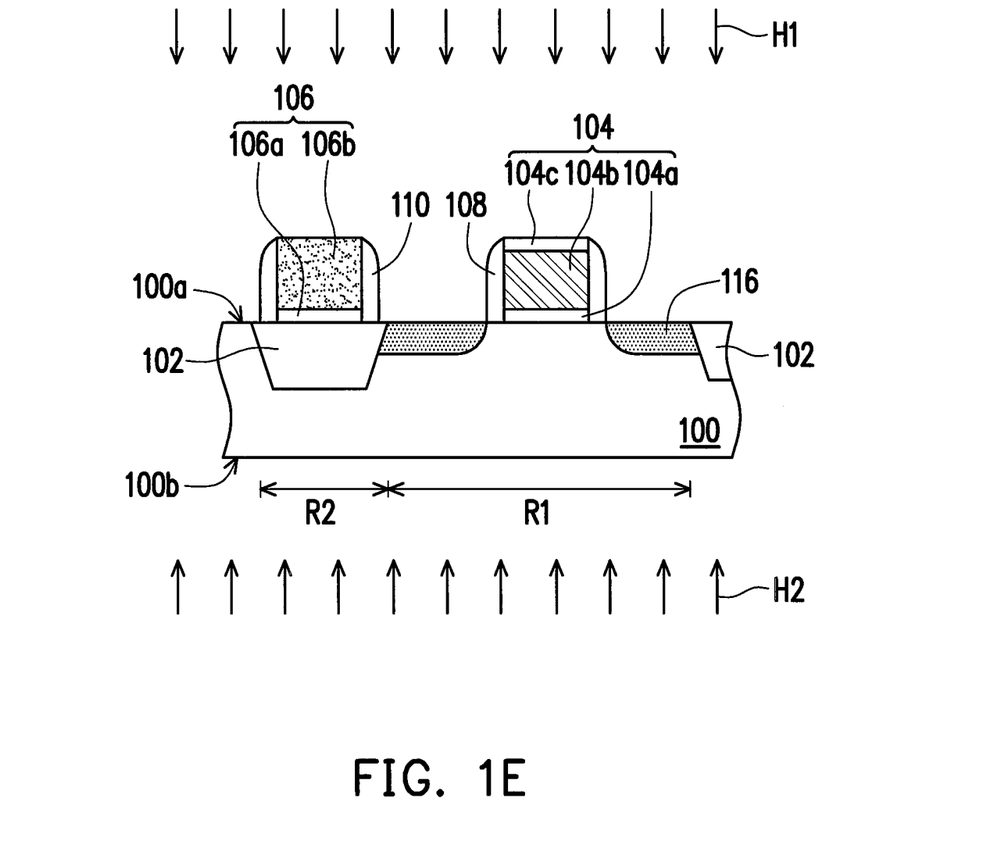

Referring to FIG. 1E, an asymmetric dual-side heating treatment is performed to the substrate 100 for annealing the polysilicon stack 106 and for activating the doped regions 116 concurrently. The asymmetric dual-side heating treatment may include a front-side heating H1 conducted toward the first surface 100a and a backside heating H2 conducted toward the second surface 100b, wherein a lamp power for the front-side heating H1 is different from that for the backside heating H2. The power for the backside heating H2 is, for example, greater than that for the front-side heating H1. In an embodiment, a power ratio of the front-side heating H1 to the backside heating H2 may range between 0.1:1 and 0.5:1. In an embodiment, a power ratio of the front-side heating H1 to the backside heating H2 may be substantially 0.2:1. The asymmetric dual-side heating treatment can be implemented by a spike annealing process, in which temperature is set at about 1025±50° C. for about 1.5±0.5 seconds (T50) annealing. It is mentioned that T50 of 1.5±0.5 seconds is defined by time duration from a temperature lower than the highest temperature by 50° C. raising to the highest temperature and then back to the temperature lower than the highest temperature by 50° C. In an embodiment, a laser annealing, i.e. millisecond annealing, process can be further performed to the substrate 100 after performing the asymmetric dual-side heating treatment. The laser annealing process can be implanted at a temperature of about 1150° C. to 1300° C. for about 0.2 milliseconds to 1.0 milliseconds.

It should be noticed that the above mentioned polysilicon resistor may be formed in a variety of areas with different pattern layout. Since silicon oxide has reflection coefficient lower than that of silicon or polysilicon, thermal absorption and emission of silicon oxide are quite different from those of silicon or polysilicon during the heating treatment. Therefore, sheet resistance of the polysilicon resistor may vary greatly after performing the heating treatment in accordance with different pattern layout or density, which is so-called pattern effect. The asymmetric dual-side heating treatment described in this invention can ameliorate the pattern effect by minimizing and compensating the difference in heat absorption and emission of different materials. Furthermore, integration of the co-implantation and the cryo-implantation for the polysilicon resistor may mitigate the varied sheet resistance which is sensitive to variation in the temperature of the heating treatment caused by the difference in pattern layout. Hence, uniformity of the heating treatment and the device characteristics can be achieved.

To substantiate the advantageous efficacy of the semiconductor process in this invention, simulation of dual-side heating treatments set at different ratios as compared with a backside heating treatment is described hereinafter. In addition, sheet resistance (Rs) of different polysilicon resistors implanted by varying conditions according to several examples is measured and compared hereinafter. It should be appreciated that the following simulation and experimental data are provided merely to illustrate effects upon uniformity achieved by variations in the power ratio of the heating treatment and the implantation conditions, but are not intended to limit the scope of the present invention.

Figure 2:
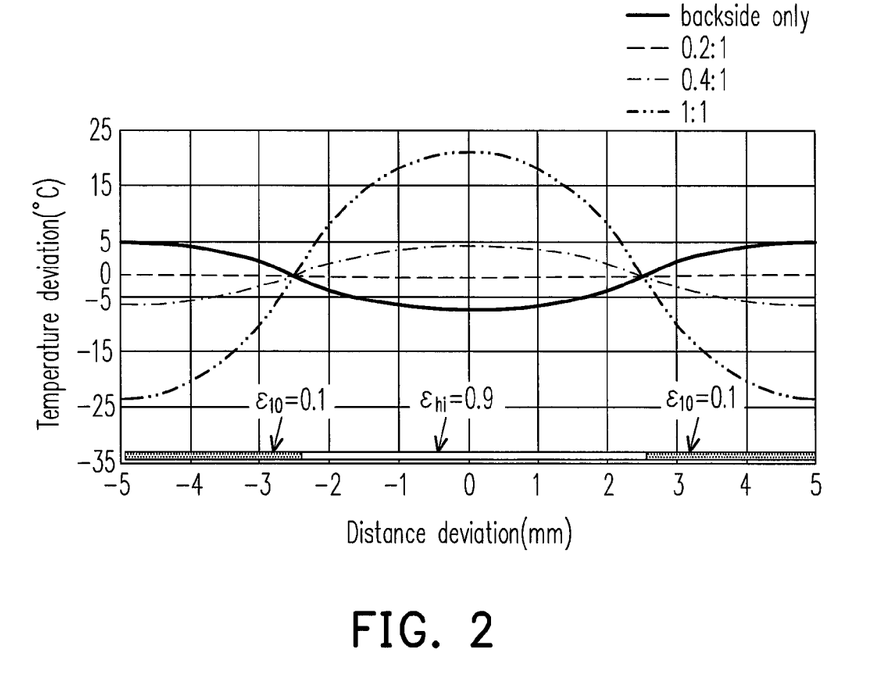
FIG. 2 depicts a simulation result illustrating temperature deviation distribution profiles of a grey body pattern while a variety of heating treatments is conducted respectively.

FIG. 2 depicts a simulation result illustrating temperature distribution profiles of a grey body pattern while a variety of heating treatments is conducted respectively. As shown in FIG. 2, asymmetric dual-side heating treatments with power ratio of 0.2:1 and 0.4:1 (front-side:backside), a symmetric dual-side heating treatment of 1:1 (front-side:backside) and a backside-only heating treatment are respectively performed to separate samples, wherein each sample concurrently has a material with high thermal coefficient ($\in_{hi}$) and another material with low thermal coefficient ($\in_{lo}$), and the high thermal coefficient ($\in_{hi}$) may be equal to 0.9 and the low thermal coefficient ($\in_{lo}$) may be equal to 0.1.

It can be observed that the materials heated by the asymmetric dual-side heating treatment (0.2:1) shows barely variation in temperature as compared with those heated by the symmetric dual-side heating treatment (1:1) and the backside-only heating treatment. In addition, a frontside-only heating treatment may lead to greater variation in temperature due to different absorption of the materials, while the backside-only heating treatment may lead to less variation in temperature due to different emission of the materials, which give rise to a pattern effect. By tuning the lamp power for the front-side and backside heating, in which the power for the backside is greater than that for the front-side, the dramatic variation in temperature of the symmetric dual-side heating treatment (1:1) may be alleviated thereby. Accordingly, the absorption variation caused by the front-side heating and the emission variation caused by the backside heating can be balanced as the power ratio of the front-side heating to the backside heating is optimized for better uniformity.

Figure 3:
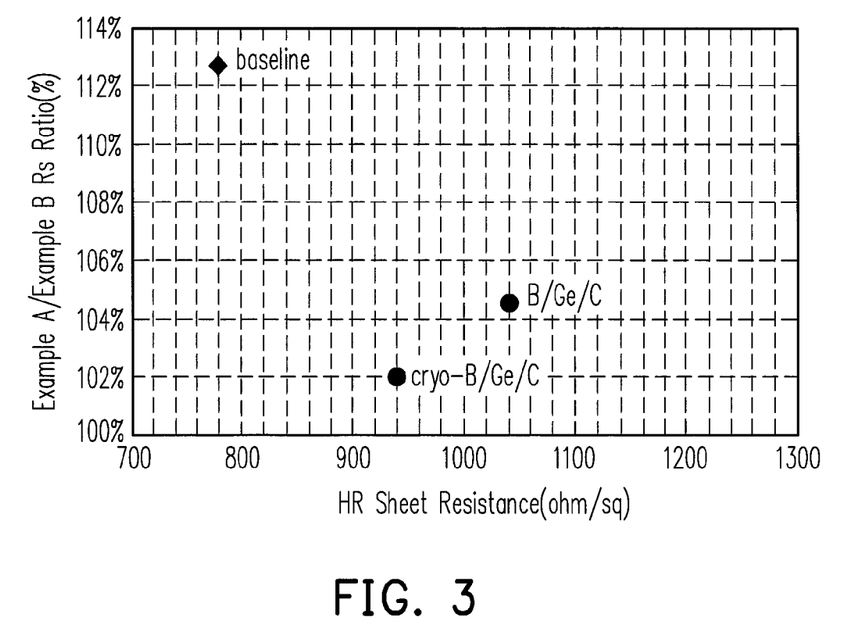
FIG. 3 depicts a comparison of sheet resistance (Rs) between Example A and Example B with different pattern layout while a variety of implantation conditions is conducted respectively.

FIG. 3 depicts a comparison of sheet resistance (Rs) between Example A and Example B with different pattern layout while a variety of implantation conditions is conducted respectively. In this experiment, Example A represents a pattern layout with lower density of the exposed silicon (about 51.5%), and Example B represents a pattern layout with higher density of the exposed silicon (about 55.5%). Moreover, the polysilicon resistor disposed in Example A has higher sheet resistance than that in Example B, and is designated as "baseline" in FIG. 3.

According to the data demonstrated in FIG. 3, when the boron, germanium and carbon species are co-implanted, designated as "B/Ge/C", into the polysilicon resistors of Examples A and B based on ordinary conditions respectively, the sheet resistance ratio of the polysilicon resistors in Examples A and B can be lowered to about 104.5% as compared with 112.5% of the baseline. It is obvious that as these three species are cryo-implanted, designated as "cryo-B/Ge/C", into the polysilicon resistors of Examples A and B the sheet resistance ratio of the polysilicon resistors disposed in Examples A and B can be extra lowered to about 102%, indicating that the co-implantation and the cryo-implantation can advantageously minimize variation in sheet resistance of the polysilicon resistor sensitive to different temperature of the heating treatment due to the difference in pattern layout or density.

In view of the above, the semiconductor process according to several embodiments described above provide the asymmetric dual-side heating treatment which can effectively mitigate the pattern effect caused by different pattern layout or density. In addition, the cryo-implantation of three different species into the polysilicon resistor may further lessen variation in polysilicon resistance. Therefore, not only resistance of the polysilicon resistors formed in different layout pattern can be coordinated without great inconsistency, but the better process uniformity is accomplished.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor process for mitigating sheet resistance variation of a polysilicon resistor, comprising:
   forming a polysilicon layer on a substrate;
   cryo-implanting the polysilicon layer with a first species, a second species and a third species at a temperature ranging between $-40°$ C. and $-120°$ C. to form the polysilicon resistor, wherein the first species comprises a germanium species, the second species comprises a carbon species, and the third species comprises a p-type species or an n-type species; and
   performing an asymmetric dual-side heating treatment to the polysilicon layer, wherein a power for a front-side heating is different from a power for a backside heating.

2. The semiconductor process according to claim 1, wherein the power for the backside heating is greater than the power for the front-side heating.

3. The semiconductor process according to claim 2, wherein a power ratio of the front-side heating to the backside heating ranges between 0.1:1 and 0.5:1.

4. The semiconductor process according to claim 3, wherein the power ratio of the front-side heating to the backside heating is 0.2:1.

5. A semiconductor process for mitigating sheet resistance variation of a polysilicon resistor, comprising:
   forming an isolation structure in a substrate;
   forming a polysilicon layer on the isolation structure; and
   cryo-implanting the polysilicon layer with a first species, a second species and a third species at a temperature ranging between $-40°$ C. and $-120°$ C. to form the polysilicon resistor, wherein the first species comprises a germanium species, the second species comprises a carbon species, and the third species comprises a p-type species or an n-type species.

6. The semiconductor process according to claim 5, wherein the step of cryo-implanting the polysilicon layer is performed with liquid nitrogen or at a temperature of $-100°$ C.

7. The semiconductor process according to claim 5, wherein the third species comprises a boron species.

8. The semiconductor process according to claim 5, wherein the third species is cryo-implanted into the polysilicon layer after cryo-implanting the first species and the second species.

9. The semiconductor process according to claim 5, after the polysilicon layer is cryo-implanted with the first species, the second species and the third species, further comprising: performing an asymmetric dual-side heating treatment to the substrate, wherein a power for a front-side heating is different from a power for a backside heating.

10. The semiconductor process according to claim 9, wherein the power for the backside heating is greater than the power for the front-side heating.

11. The semiconductor process according to claim 10, wherein a power ratio of the front-side heating to the backside heating ranges between 0.1:1 and 0.5:1.

12. The semiconductor process according to claim 11, wherein the power ratio of the front-side heating to the backside heating is 0.2:1.

13. The semiconductor process according to claim 9, wherein the asymmetric dual-side heating treatment comprises a spike annealing process.

14. A semiconductor process for mitigating sheet resistance variation of a polysilicon resistor, comprising:
   forming an isolation structure in a substrate;
   forming a polysilicon stack on the isolation structure;
   forming a gate structure on the substrate;
   cryo-implanting the polysilicon stack with a first species, a second species and a third species at a temperature ranging between $-40°$ C. and $-120°$ C. to form the polysilicon resistor, wherein the first species comprises a germanium species, the second species comprises a carbon species, and the third species comprises a p-type species or an n-type species;
   forming doped regions in the substrate adjacent to respective sides of the gate structure; and
   performing an asymmetric dual-side heating treatment to the substrate for annealing the polysilicon stack and for activating the doped regions, wherein a power for a front-side heating is different from a power for a backside heating.

15. The semiconductor process according to claim 14, wherein the step of cryo-implanting the polysilicon stack is performed with liquid nitrogen or at a temperature of $-100°$ C.

16. The semiconductor process according to claim 14, wherein the third species comprises a boron species.

17. The semiconductor process according to claim 14, wherein the third species is cryo-implanted into the polysilicon stack after cryo-implanting the first species and the second species.

18. The semiconductor process according to claim 14, wherein the power for the backside heating is greater than the power for the front-side heating.

19. The semiconductor process according to claim 18, wherein a power ratio of the front-side heating to the backside heating ranges between 0.1:1 and 0.5:1.

20. The semiconductor process according to claim 19, wherein the power ratio of the front-side heating to the backside heating is 0.2:1.

21. The semiconductor process according to claim 14, wherein the asymmetric dual-side heating treatment comprises a spike annealing process.

22. The semiconductor process according to claim 14, further comprising: performing a laser annealing process to the substrate after performing the asymmetric dual-side heating treatment.

23. A semiconductor process for mitigating sheet resistance variation of a polysilicon resistor, comprising:
   forming an isolation structure in a substrate;
   forming a polysilicon stack on the isolation structure;
   forming a gate structure on the substrate, wherein the gate structure and the polysilicon stack are formed simultaneously;
   cryo-implanting the polysilicon stack with a first species, a second species and a third species at a temperature ranging between $-40°$ C. and $-120°$ C. to form the polysilicon resistor, wherein the first species comprises a germanium species, the second species comprises a carbon species, and the third species comprises a p-type species or an n-type species;
   forming doped regions in the substrate adjacent to respective sides of the gate structure; and
   performing an asymmetric dual-side heating treatment to the substrate for annealing the polysilicon stack and for activating the doped regions, wherein a power for a front-side heating is different from a power for a backside heating.

24. The semiconductor process according to claim 23, wherein the third species is cryo-implanted into the polysilicon stack after cryo-implanting the first species and the second species.

25. The semiconductor process according to claim 23, wherein the power for the backside heating is greater than the power for the front-side heating.

26. The semiconductor process according to claim 25, wherein a power ratio of the front-side heating to the backside heating ranges between 0.1:1 and 0.5:1.

27. The semiconductor process according to claim 23, wherein the asymmetric dual-side heating treatment comprises a spike annealing process.

28. The semiconductor process according to claim 23, further comprising: performing a laser annealing process to the substrate after performing the asymmetric dual-side heating treatment.

* * * * *